(12) United States Patent
Yoon et al.

(10) Patent No.: US 9,559,169 B2
(45) Date of Patent: Jan. 31, 2017

(54) THIN FILM TRANSISTOR ARRAY SUBSTRATE AND ORGANIC LIGHT-EMITTING DIODE DISPLAY EMPLOYING THE SAME

(71) Applicant: Samsung Display Co., Ltd., Yongin, Gyeonggi-Do (KR)

(72) Inventors: Joosun Yoon, Yongin (KR); Yongjae Jang, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/644,040

(22) Filed: Mar. 10, 2015

(65) Prior Publication Data

US 2016/0064462 A1    Mar. 3, 2016

(30) Foreign Application Priority Data

Aug. 29, 2014 (KR) .................. 10-2014-0114520

(51) Int. Cl.
| | |
|---|---|
| *H01L 27/32* | (2006.01) |
| *H01L 29/10* | (2006.01) |
| *H01L 27/12* | (2006.01) |
| *H01L 29/786* | (2006.01) |
| *H01L 29/423* | (2006.01) |

(52) U.S. Cl.
CPC ....... *H01L 29/1033* (2013.01); *H01L 27/1255* (2013.01); *H01L 27/3265* (2013.01); *H01L 29/42384* (2013.01); *H01L 29/78645* (2013.01); *H01L 29/78675* (2013.01); *H01L 2227/323* (2013.01)

(58) Field of Classification Search
CPC ...... H01L 51/00; H01L 27/28; H01L 2251/00; H01L 25/046
See application file for complete search history.

(56) References Cited

U.S. PATENT DOCUMENTS

| | | | |
|---|---|---|---|
| 2005/0184283 A1 | 8/2005 | Maeda et al. | |
| 2009/0311854 A1 | 12/2009 | Cha | |
| 2011/0163661 A1 | 7/2011 | Lee et al. | |
| 2014/0034923 A1 | 2/2014 | Kim et al. | |
| 2015/0279913 A1* | 10/2015 | Gates | H01L 27/3248 |
| | | | 257/40 |

FOREIGN PATENT DOCUMENTS

| | | |
|---|---|---|
| KR | 10-2005-0003496 A | 1/2005 |
| KR | 10-2005-0082763 A | 8/2005 |
| KR | 10-2010-0041180 A | 4/2010 |
| KR | 10-2011-0080386 A | 7/2011 |
| KR | 10-2014-0018623 A | 2/2014 |

* cited by examiner

*Primary Examiner* — Mamadou Diallo
(74) *Attorney, Agent, or Firm* — Knobbe Martens Olson & Bear LLP

(57) ABSTRACT

A thin film transistor (TFT) array substrate and an organic light-emitting diode display employing the same are disclosed. In one aspect, the substrate includes at least one TFT, the TFT including a substrate and a semiconductor pattern comprising a source region, a channel region, and a drain region. The TFT also includes a gate insulating layer covering the semiconductor pattern, a side gate electrode electrically insulated from the semiconductor pattern and formed over at least one side of the channel region, and a top gate electrode formed over the gate insulating layer so as to partially overlap the semiconductor pattern, the side gate electrode and the top gate electrode electrically connected to each other.

20 Claims, 6 Drawing Sheets

THIN FILM TRANSISTOR ARRAY SUBSTRATE AND ORGANIC LIGHT-EMITTING DIODE DISPLAY EMPLOYING THE SAME

CROSS-REFERENCE TO RELATED APPLICATIONS

This application claims the benefit of Korean Patent Application No. 10-2014-0114520, filed on Aug. 29, 2014, in the Korean Intellectual Property Office, the disclosure of which is incorporated herein in its entirety by reference.

BACKGROUND

Field

The described technology generally relates to a thin film transistor array substrate and an organic light-emitting diode (OLED) display employing the same.

Description of the Related Technology

Thin film transistor array substrates include thin film transistors, storage capacitors, wirings which connect the thin film transistors and the storage capacitors, and the like. Thin film transistor array substrates can be employed in various display apparatuses.

OLED displays have a matrix of OLED pixels, each one including a hole injection electrode, an electron injection electrode, and an organic emission layer formed between the hole injection electrode and the electron injection electrode. Also, an OLED display is self-emissive, light being generated as excitons which are formed as holes injected from the hole injection electrode and electrons injected from the electron injection electrode are combined in the organic emission layer fall from an excited state into a ground state.

OLED displays do not need a light source. Thus, OLED displays can be driven at a low voltage and configured to be slim and light. Furthermore, they are undergoing development as a next-generation display device because of high-quality properties such as wide viewing angles, high contrast, and fast response rate.

SUMMARY OF CERTAIN INVENTIVE ASPECTS

One inventive aspect is a thin film transistor array substrate including a thin film transistor of high performance, and an OLED display employing the thin film transistor array substrate.

Another aspect is a thin film transistor array substrate that includes at least one thin film transistor, wherein the thin film transistor includes a substrate; a semiconductor pattern including a source region, a channel region, and a drain region in the substrate; a gate insulating layer covering the semiconductor pattern; a side gate electrode insulated from the semiconductor pattern and formed in at least one side surface of the channel region; and a top gate electrode formed on the gate insulating layer to partially overlap the semiconductor pattern, and wherein the side gate electrode and the top gate electrode are electrically connected with each other.

The side gate electrode can be placed inside a via hole that penetrates through the gate insulating layer.

The thin film transistor array substrate can further include a first interlayer dielectric covering the top gate electrode. The side gate electrode can be placed inside a via hole that penetrates through the gate insulating layer and the first interlayer dielectric, and the via hole can meet the top gate electrode.

The thin film transistor array substrate can further include a storage capacitor, the storage capacitor including a first electrode connected with the top gate electrode, and a second electrode provided on an upper portion of the first electrode and insulated from the first electrode.

The top gate electrode can be integrally formed on the same layer as the first electrode.

The channel region can be in a bent shape.

The thin film transistor array substrate can further include a source electrode connected to the source region, and a drain electrode connected to the drain region. The side gate electrode can be formed of the same material as the source electrode and the drain electrode.

Another aspect is a thin film transistor array substrate that includes a substrate; a semiconductor pattern including a source region, a channel region, and a drain region in the substrate; a gate insulating layer covering the semiconductor pattern; a side gate electrode insulated from the semiconductor pattern and formed in at least one side surface of the semiconductor pattern; a top gate electrode formed on the gate insulating layer to partially overlap the semiconductor pattern; a first interlayer dielectric covering the top gate electrode; a storage capacitor using the top gate electrode as a first electrode and including a second electrode which is provided on the first interlayer dielectric and overlaps the first electrode; and a second interlayer dielectric formed on the second electrode, wherein the side gate electrode is placed inside a via hole that penetrates through the gate insulating layer, the first interlayer dielectric, and the second interlayer dielectric.

The thin film transistor array substrate can further include a source electrode provided on the second interlayer dielectric and connected to the source region through a first contact hole, and a drain electrode provided on the second interlayer dielectric and connected to the drain region through a second contact hole. The first contact hole and the second contact hole can penetrate through the gate insulating layer, the first interlayer dielectric, and the second interlayer dielectric.

The source electrode and the drain electrode can be formed of the same material as the side gate electrode.

The thin film transistor array substrate can further include a planarization layer covering the source electrode and the drain electrode and including an opening which exposes a portion of the drain electrode, and a pixel electrode formed on the planarization layer and connected with the drain electrode.

The side gate electrode can be placed inside a via hole that penetrates through the gate insulating layer, the first interlayer dielectric, the second interlayer dielectric, and the planarization layer.

The side gate electrode can be formed of the same material as the pixel electrode.

Another aspect is an OLED display that includes a substrate; a semiconductor pattern including a source region, a channel region, and a drain region in the substrate; a gate insulating layer covering the semiconductor pattern; a side gate electrode insulated from the semiconductor pattern and formed in at least one side surface of the semiconductor pattern; a top gate electrode formed on the gate insulating layer to partially overlap the semiconductor pattern; a source electrode connected to the source region and a drain electrode connected to the drain region; and an organic light-emitting diode connected to the source electrode or the drain electrode, wherein the side gate electrode is placed inside a via hole that penetrates through the gate insulating layer.

The organic light-emitting diode can include a pixel electrode, an intermediate layer including an organic light-emitting layer, and an opposite electrode.

The side gate electrode can be formed of the same material as the pixel electrode.

The side gate electrode can be formed of the same material as the source electrode or the drain electrode.

The OLED display can further include a storage capacitor, the storage capacitor including a first electrode, a second electrode, and an interlayer dielectric formed between the first electrode and the second electrode. The top gate electrode can be used as the first electrode, and the second electrode can overlap the top gate electrode.

Another aspect is a thin film transistor (TFT) array substrate comprising at least one TFT, wherein the TFT comprises a substrate and a semiconductor pattern comprising a source region, a channel region, and a drain region. The TFT also comprises a gate insulating layer covering the semiconductor pattern, a side gate electrode electrically insulated from the semiconductor pattern and formed over at least one side of the channel region, and a top gate electrode formed over the gate insulating layer so as to partially overlap the semiconductor pattern, wherein the side gate electrode and the top gate electrode are electrically connected to each other.

In the above substrate, at least a portion of the side gate electrode is formed inside a via hole penetrating through the gate insulating layer.

The above substrate further comprises a first interlayer dielectric layer covering the top gate electrode, wherein at least a portion of the side gate electrode is formed inside a via hole penetrating through the gate insulating layer and the first interlayer dielectric layer, and wherein the side gate electrode is connected to the top gate electrode through the via hole.

The above substrate further comprises a storage capacitor comprising a first electrode connected to the top gate electrode and a second electrode formed over an upper portion of the first electrode and electrically insulated from the first electrode.

In the above substrate, the top gate electrode is integrally formed on the same layer as the first electrode.

In the above substrate, the channel region non-linear.

The above substrate further comprises a source electrode connected to the source region and a drain electrode connected to the drain region, wherein the side gate electrode is formed of the same material as the source and drain electrodes.

Another aspect is a thin film transistor (TFT) array substrate comprising a substrate and a semiconductor pattern comprising a source region, a channel region, and a drain region. The substrate also comprises a gate insulating layer covering the semiconductor pattern, a side gate electrode electrically insulated from the semiconductor pattern and formed over at least one side of the semiconductor pattern, a top gate electrode formed over the gate insulating layer so as to partially overlap the semiconductor pattern, a first interlayer dielectric layer covering the top gate electrode, a storage capacitor configured to use the top gate electrode as a first electrode, wherein the storage capacitor comprises a second electrode formed over the first interlayer dielectric layer and overlapping the first electrode. The substrate also comprises a second interlayer dielectric layer formed over the second electrode, wherein at least a portion of the side gate electrode is formed inside a via hole penetrating through the gate insulating layer, the first interlayer dielectric layer, and the second interlayer dielectric layer.

The above substrate further comprises a source electrode formed over the second interlayer dielectric layer and connected to the source region through a first contact hole and a drain electrode formed over the second interlayer dielectric layer and connected to the drain region through a second contact hole, wherein the first and second contact holes penetrate through the gate insulating layer and the first and second interlayer dielectric layers.

In the above substrate, the source and drain electrodes are formed of the same material as the side gate electrode.

The above substrate further comprises a planarization layer at least partially covering the source and drain electrodes and comprising an opening which exposes a portion of the drain electrode. The above substrate further comprises a pixel electrode formed over the planarization layer and connected to the drain electrode.

In the above substrate, at least a portion of the side gate electrode is formed inside a via hole penetrating through the gate insulating layer, the first and second interlayer dielectric layers, and the planarization layer.

In the above substrate, the side gate electrode is formed of the same material as the pixel electrode.

Another aspect is an organic light-emitting diode (OLED) display, comprising a substrate and a semiconductor pattern comprising a source region, a channel region, and a drain region. The display also comprises a gate insulating layer covering the semiconductor pattern, a side gate electrode electrically insulated from the semiconductor pattern and formed over at least one side of the semiconductor pattern, a top gate electrode formed over the gate insulating layer so as to partially overlap the semiconductor pattern, source and drain electrodes respectively connected to the source and drain regions, and an OLED electrically connected to the source electrode or the drain electrode, wherein at least a portion of the side gate electrode is formed inside a via hole penetrating through the gate insulating layer.

In the above display, the OLED comprises a pixel electrode, an intermediate layer comprising an organic light-emitting layer, and an opposite electrode.

In the above display, the side gate electrode is formed of the same material as the pixel electrode.

In the above display, the side gate electrode is formed of the same material as the source electrode or the drain electrode.

The above display further comprises a storage capacitor comprising a first electrode, a second electrode and an interlayer dielectric layer formed between the first electrode and the second electrode, wherein the top gate electrode is configured to be used as the first electrode, and wherein the second electrode overlaps the top gate electrode.

In the above display, the side gate electrode is higher than the top gate electrode.

In the above display, a bottom surface of the side gate electrode is closer to the surface than a bottom surface of the top gate electrode.

DETAILED DESCRIPTION OF CERTAIN INVENTIVE EMBODIMENTS

Figure 1A:
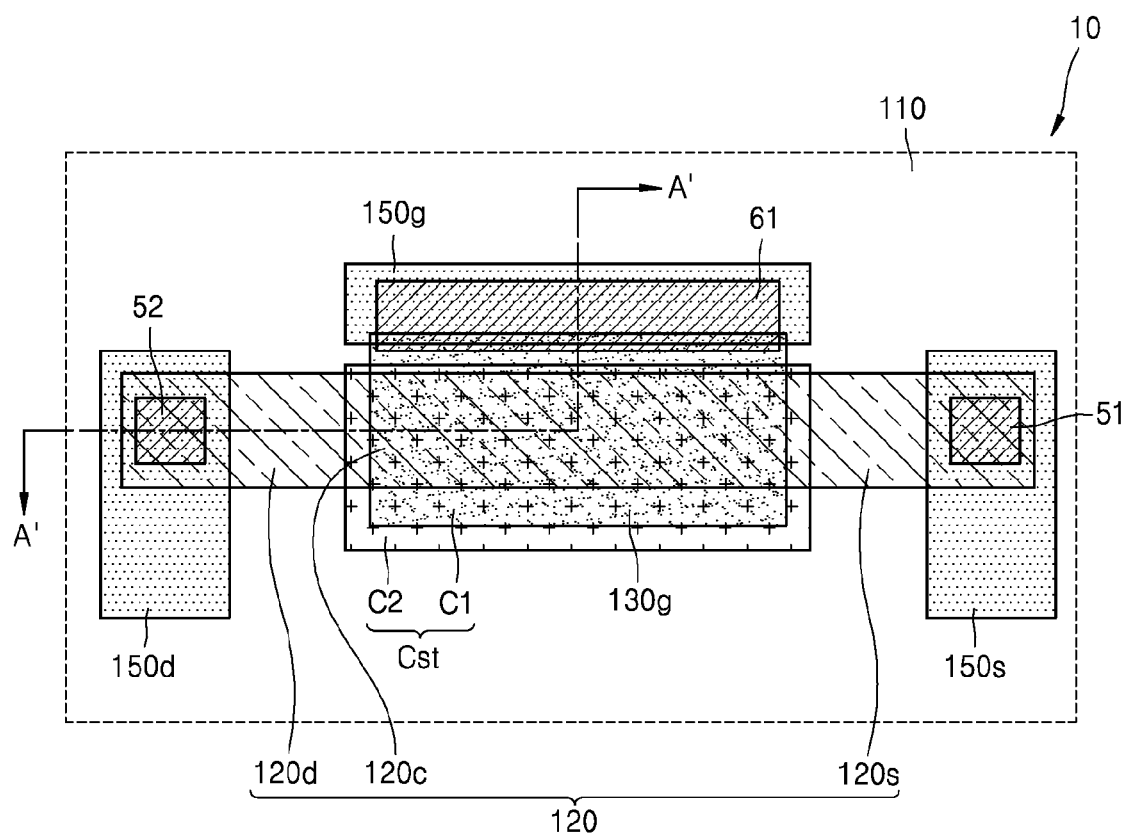
FIG. 1A is a schematic plan view of one thin film transistor included in a thin film transistor array substrate according to an embodiment.

As the described technology allows for various changes and numerous embodiments, exemplary embodiments will be illustrated in the drawings and described in detail in the written description. The effect and feature of the described technology and the method of accomplishing the same will become apparent from the following description of the embodiments in detail, taken in conjunction with the accompanying drawings. This technology can, however, be embodied in many different forms and should not be construed as limited to the exemplary embodiments set forth herein.

Hereinafter, the described technology will be described in detail with reference to the accompanying drawings, in which exemplary embodiments of the described technology are shown Like reference numerals in the drawings denote like elements, and thus their repeated description will be omitted.

While such terms as "first" and "second" can be used to describe various components, such components must not be limited to the above terms. The above terms are used only to distinguish one component from another.

As used herein, the singular forms "a," "an," and "the" are intended to include the plural forms as well, unless the context clearly indicates otherwise.

It will be further understood that the terms such as "include," "comprise," and "have" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components can be present.

Sizes of components in the drawings can be exaggerated for convenience of explanation. In other words, since sizes and thicknesses of components in the drawings are arbitrarily illustrated for convenience of explanation, the following embodiments are not limited thereto.

As used herein, the term "and/or" includes any and all combinations of one or more of the associated listed items. Expressions such as "at least one of," when preceding a list of elements, modify the entire list of elements and do not modify the individual elements of the list. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Figure 1B:
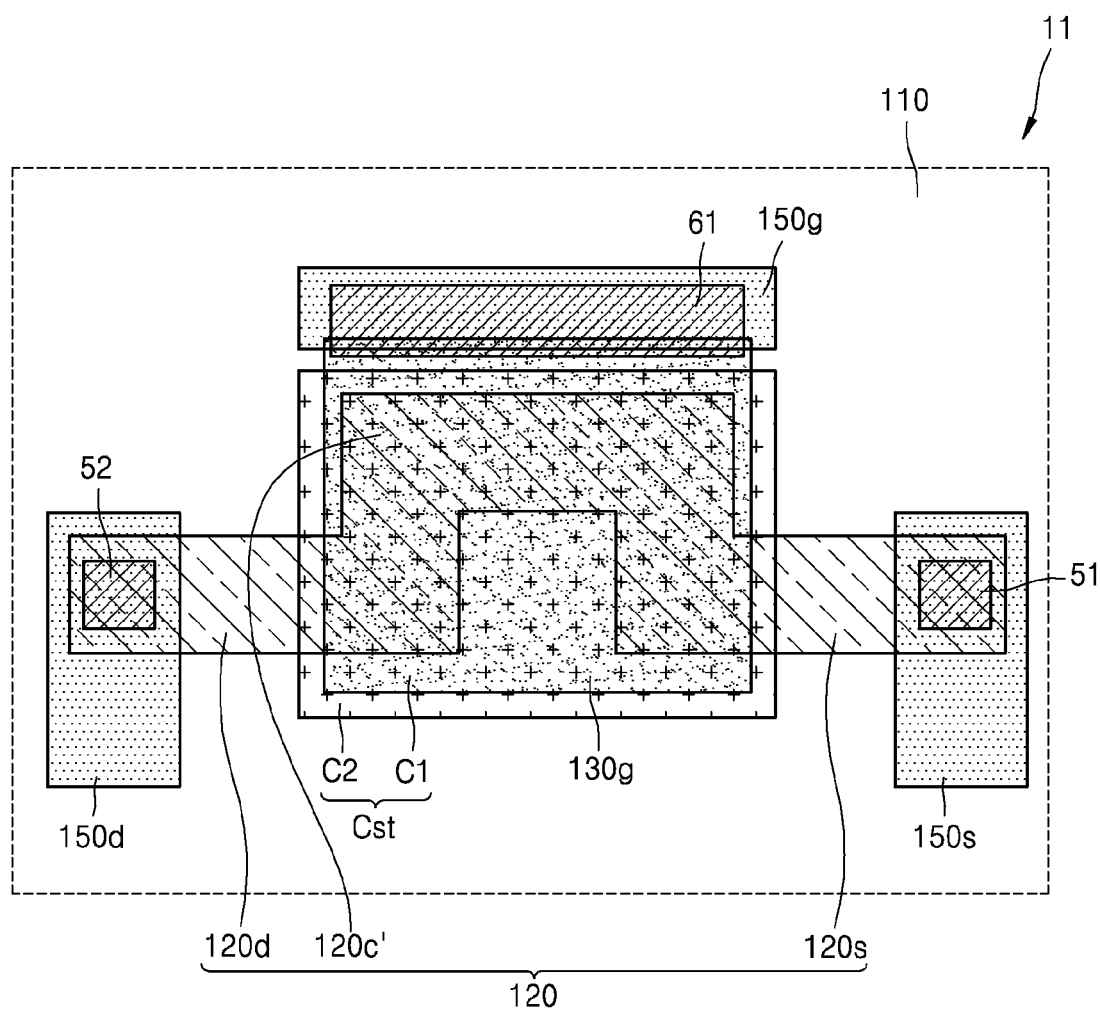
FIG. 1B is a schematic plan view of one thin film transistor included in a thin film transistor array substrate according to another embodiment.
Figure 2:
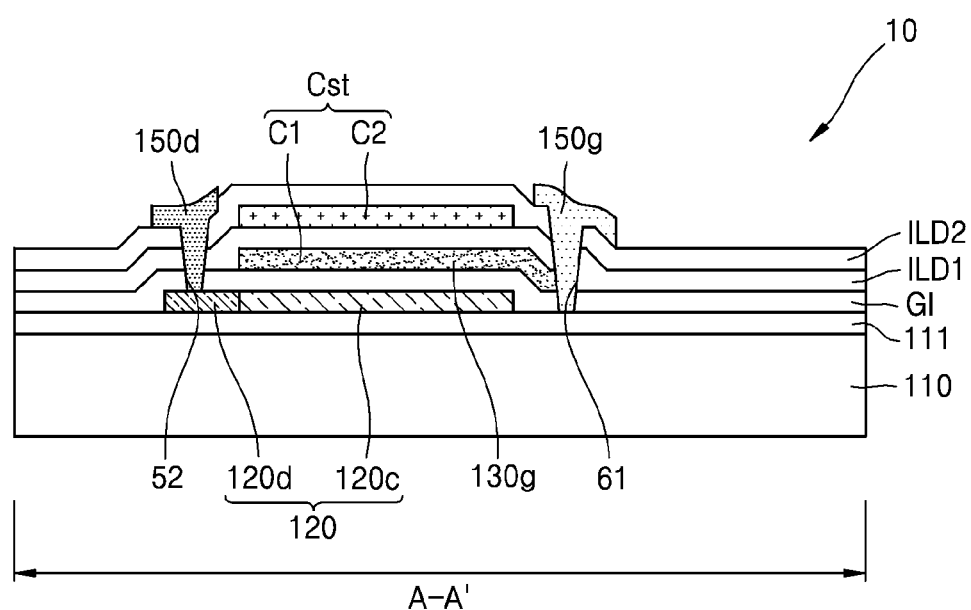
FIG. 2 is a cross-sectional view of the thin film transistor array substrate of FIG. 1A which is taken along a line A-A'.

FIG. 1A is a schematic plan view of one thin film transistor included in a thin film transistor array substrate according to an embodiment. FIG. 1B is a schematic plan view of one thin film transistor included in a thin film transistor array substrate according to another embodiment. FIG. 2 is a cross-sectional view of the thin film transistor array substrate of FIG. 1A which is taken along a line A-A'.

The thin film transistor array substrate 10 or 11 can include a plurality of thin film transistors (TFTs) that are regularly arranged, a plurality of TFTs that are irregularly arranged, or only one TFT.

Referring to FIGS. 1A through 2, the thin film transistor array substrate 10 or 11 includes a TFT including a substrate 110, a semiconductor pattern 120, a gate insulating layer GI, a side gate electrode 150g, and a top gate electrode 130g. Also, the thin film transistor array substrate 10 or 11 can further include a source electrode 150s, a drain electrode 150d, and a storage capacitor Cst.

A channel by the top gate electrode 130g and also an additional channel by the side gate electrode 150g can be formed in the semiconductor pattern 120 of the TFT. Accordingly, field mobility and switching performance of the TFT can be improved.

The substrate 110 can be formed of various materials such glass, ceramic, plastic, or metal materials. The substrate 110 can be a flexible substrate.

A buffer layer 111 can be formed on the substrate 110. The buffer layer 111 provides a planar surface to a top of the substrate 110 and can be formed of an insulating material to prevent external moisture and foreign materials from penetrating through the substrate 110. The buffer layer 111 can serve as an etch-stop layer in time of forming a via hole 61. In some embodiments, the buffer layer 111 uses a dual layer of a silicon nitride (SiNx) film and a silicon oxide (SiOx) film. The buffer layer 111 can be omitted according to cases.

The semiconductor pattern 120 is provided on the buffer layer 111. The semiconductor pattern 120 can be formed of polysilicon and can include a channel region 120c where no impurity is doped. The semiconductor pattern 120 can also include a source region 120s and a drain region 120d which are doped with impurities and formed at both side surfaces of the channel region 120c. The impurities can vary according to a type of the TFT and can be an N-type impurity or a P-type impurity. The N-type impurity includes phosphorus (P), arsenic (As), antimony (Sb), and the P-type impurity includes boron (B).

The thin film transistor array substrate 10 of FIG. 1A shows that the channel region 120c of the semiconductor pattern 120 is substantially linear, and the thin film transistor array substrate 11 of FIG. 1B shows that a channel region 120c' of the semiconductor pattern 120 is bent.

As such, by forming the channel region 120c' to be bent, a long channel region can be formed in a narrow space. Accordingly, since the channel region 120c' of the TFT can be formed long, a driving range of a gate voltage applied to the top gate electrode 130g is increased. Thus, gradation of light which is emitted from an organic light-emitting diode (OLED) can be controlled more minutely by changing a level of the gate voltage. As a result, resolution of an OLED display can be increased and quality of a displayed image can be improved. The channel region of a TFT can be bent in various forms such as "S", "M", and "W".

On a side surface of the channel region 120c or 120c', the side gate electrode 150g is formed adjacent to the channel region 120c or 120c'. Thus, not only the channel by the top gate electrode 130g but also the additional channel by the side gate electrode 150g can be formed in the channel region 120c or 120c'. The side gate electrode 150g can be formed adjacent to several side surfaces of the channel region 120c or 120c' as well as on the side surface of the channel region 120c or 120c'.

The gate insulating layer GI is stacked over the entire surface of the substrate 110 so as to at least partially cover the semiconductor pattern 120. The gate insulating layer GI serves to insulate the semiconductor pattern 120 from both the top gate electrode 130g and the side gate electrode 150g. The gate insulating layer GI can include an organic or inorganic insulator. In some embodiments, the gate insulating layer GI includes a SiNx film, a SiOx film, hafnium oxide (HfOx) and aluminum oxide (AlOx).

The top gate electrode 130g is placed on the gate insulating layer GI such that at least a portion of the top gate electrode 130g overlaps the semiconductor pattern 120. The top gate electrode 130g can be formed of at least one metal selected from molybdenum (Mo), aluminum (Al), platinum (Pt), palladium (Pd), silver (Ag), magnesium (Mg), gold (Au), Nickel (Ni), neodymium (Nd), iridium (Ir), chromium (Cr), lithium (Li), calcium (Ca), titanium (Ti), tungsten (W), and copper (Cu).

The top gate electrode 130g can be connected to a first electrode C1 of the storage capacitor Cst. Also, the storage capacitor Cst can be formed to at least partially overlap the top gate electrode 130g. As the storage capacitor Cst at least partially overlaps the TFT, areas of the first electrode C1 and a second electrode C2 can be sufficiently secured. Accordingly, a sufficient storage capacity of the storage capacitor Cst can be secured.

The first electrode C1 and the top gate electrode 130g are formed together on the same layer as in the diagram. However, the described technology is not limited thereto. The first electrode C1 of the storage capacitor Cst can also be formed in a different layer from the top gate electrode 130g to be connected to the top gate electrode 130g through a contact hole and the like.

A first interlayer dielectric ILD1 is placed over the entire surface of the substrate 110 to at least partially cover the top gate electrode 130g and the first electrode C1. The first interlayer dielectric ILD1 can serve to insulate the top gate electrode 130g from wirings formed in an upper portion of the first interlayer dielectric ILD1. Also, the first interlayer dielectric ILD1 can serve as a dielectric layer of the storage capacitor Cst. A thickness and/or a material of the first interlayer dielectric ILD1 can be determined based at least in part on a storage capacity of the storage capacitor Cst.

The first interlayer dielectric ILD1 can be formed of an inorganic material or an organic material. When the first interlayer dielectric ILD1 is formed of inorganic material, the first interlayer dielectric ILD1 can be formed of metallic oxide or metallic nitride. In some embodiments, the inorganic material includes silicon oxide (SiOx), silicon nitride (SiNx), silicon oxy-nitride (SiON), aluminum oxide ($Al_2O_3$), titanium oxide ($TiO_2$), tantalum oxide ($Ta_2O_5$), hafnium oxide ($HfO_2$), or zirconium oxide ($ZrO_2$). The first interlayer dielectric ILD1 can have a film formed of the inorganic material such as SiOx and/or SiNx in multilayers or a single layer. In some embodiments, the first interlayer dielectric ILD1 has a dual structure formed of SiOx and SiNx, or SiNx and SiOx.

When the first interlayer dielectric ILD1 is formed of organic material, the first interlayer dielectric ILD1 can be formed of at least one material from polyacrylates resin, epoxy resin, phenolic resin, polyamides resin, polyimides resin, unsaturated polyesters resin, poly phenylenethers resin, poly phenylenesulfides resin, and benzocyclobutene (BCB).

A second interlayer dielectric ILD2 can be formed over the entire surface of the substrate 110 to at least partially cover the second electrode C2 of the storage capacitor Cst.

The second interlayer dielectric ILD2 can be formed of the inorganic material or the organic material. When the second interlayer dielectric ILD2 is formed of the inorganic material, the second interlayer dielectric ILD2 can be metallic oxide or metallic nitride. In some embodiments, the inorganic material includes SiOx, SiNx, SiON, $Al_2O_3$, $TiO_2$, $Ta_2O_5$, $HfO_2$, or $ZrO_2$. The second interlayer dielectric ILD2 can have a film formed of the inorganic material such as SiOx and/or SiNx in multilayers or a single layer. In some embodiments, the second interlayer dielectric ILD2 has the dual structure of SiOx and SiNx or SiNx and SiOx.

When the second interlayer dielectric ILD2 is formed of the organic material, the second interlayer dielectric ILD2 can be formed of at least one material from polyacrylates resin, epoxy resin, phenolic resin, polyamides resin, polyimides resin, unsaturated polyesters resin, poly phenylenethers resin, poly phenylenesulfides resin, and BCB.

The source electrode 150s can be formed on the second interlayer dielectric ILD2 and connected to the source region 120s through a first contact hole 51. The drain electrode 150d can be formed on the second interlayer dielectric ILD2 and connected to the drain region 120d through a second contact hole 52. That is, the source electrode 150s can fill in the first contact hole 51 so as to be connected to the source region 120s of the semiconductor pattern 120, and the drain electrode 150d can fill in the second contact hole 52 so as to be connected to the drain region 120d of the semiconductor pattern 120.

The first and second contact holes 51 and 52 can penetrate through the second interlayer dielectric ILD2, the first interlayer dielectric ILD1, and the gate insulating layer GI to expose an upper surface of the semiconductor pattern 120.

The source and drain electrodes 150s and 150d can be substantially simultaneously formed of the same material. The source electrode 150s and the drain electrode 150d can be formed of Al, Mo, Ti, Cu and the like. In some embodiments, the source and drain electrodes 150s and 150d have a stacked structure of Ti/Cu, Mo/Al/Mo, Mo/AlGe/Mo, or Ti/Al/Ti.

The side gate electrode 150g can be formed on the second interlayer dielectric ILD2 and can be formed on the side surface of the channel region 120c of the semiconductor pattern 120 through the via hole 61. In some embodiments, the side gate electrode 150g can be placed inside the via hole 61 to be formed on one side surface of the channel region 120c. The via hole 61 can penetrate through the second interlayer dielectric ILD2, the first interlayer dielectric ILD1, and the gate insulating layer GI to expose an upper surface of the buffer layer 111 or the substrate 110. In some embodiments, the via hole 61 penetrates up to a portion of the buffer layer 111 or a portion of the substrate 110.

The via hole 61 can be formed at a predetermined distance apart from the semiconductor pattern 120. The separation distance between the via hole 61 and the semiconductor pattern 120 can be set to a distance at which the additional channel can be formed in the channel region 120c or 120c' by an electric field by the side gate electrode 150g which is to be placed inside the via hole 61.

The via hole 61 can be extended in a length direction of one side surface of the channel region 120c or 120c' to be substantially the same in length as the side surface of the channel region 120c or 120c'.

The via hole 61 can meet a side surface of the top gate electrode 130g. Accordingly, the side gate electrode 150g which is to be placed inside the via hole 61 can be connected to the top gate electrode 130g.

The side gate electrode 150g can be substantially simultaneously formed of the same material as the source and drain electrodes 150s and 150d. The side gate electrode 150g can be formed of Al, Mo, Ti and Cu. In some embodiments, the side gate electrode 150g has the stacked structure of Ti/Cu, Mo/Al/Mo, Mo/AlGe/Mo, or Ti/Al/Ti.

As described above, as the TFT according to one or more embodiments includes the top gate electrode 130g and the side gate electrode 150g, additional channels can be formed in the channel region 120c of the semiconductor pattern 120. Accordingly, field mobility and switching performance of the TFT can be improved.

Figure 3:
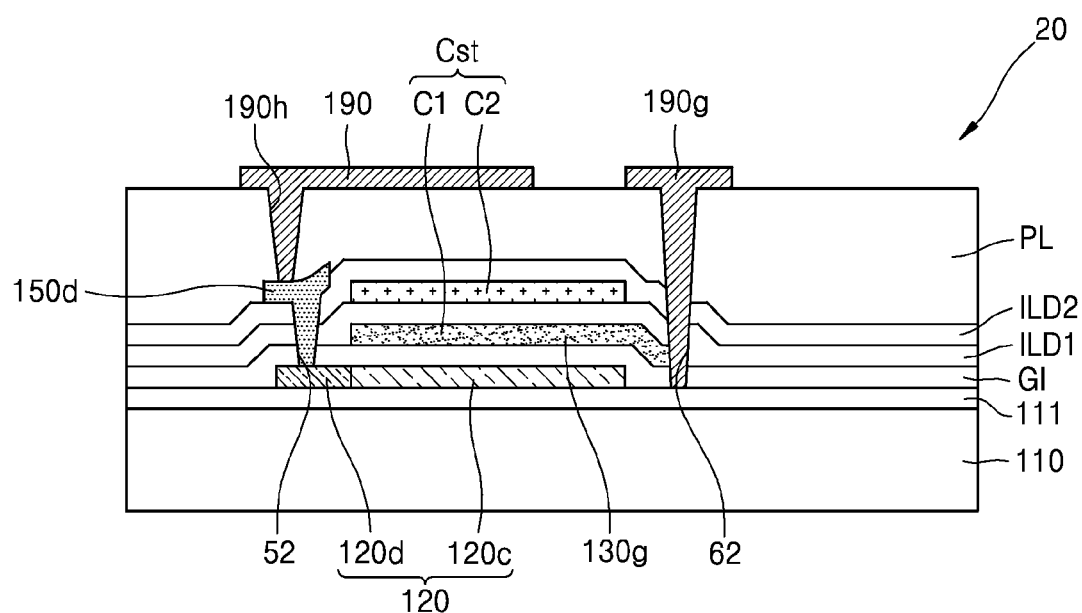
FIG. 3 is a cross-sectional view of a thin film transistor array substrate according to another embodiment.

FIG. 3 is a cross-sectional view of a thin film transistor array substrate 20 according to another embodiment. In FIG. 3, the same reference numerals as in FIG. 2 denote the same members as in FIG. 2. Repeated descriptions will be omitted for simplification of explanation.

The thin film transistor array substrate 20 can include a plurality of TFTs that are regularly arranged, a case plurality of TFTs that are irregularly arranged, or only one TFT.

The thin film transistor array substrate 20 includes a TFT including the substrate 110, the semiconductor pattern 120, the gate insulating layer GI, a side gate electrode 190g, and the top gate electrode 130g. Also, the thin film transistor array substrate 20 can further include a source electrode (not shown), the drain electrode 150d, the storage capacitor Cst, and a pixel electrode 190.

Not only a channel by the top gate electrode 130g but also an additional channel by the side gate electrode 190g can be formed in the semiconductor pattern 120 of the TFT. Accordingly, field mobility and switching performance of the TFT can be improved.

A planarization layer PL can be formed over the entire surface of the substrate 110 while at least partially covering the source electrode (not shown) and the drain electrode 150d. The planarization layer PL can be provided with an insulator and can be formed in a single layer or plural layers of an inorganic material, an organic material, or an organic/inorganic compound. In some embodiments, the planarization layer PL is formed of the organic material. As the planarization layer PL can be formed thicker when the planarization layer PL is formed of the organic material than when the planarization layer PL is formed of the inorganic material, parasitic capacitance can be reduced. In some embodiments, as the planarization layer PL is coated with a material such as polyacrylates, polyimides, or BCB, the planarization layer PL ranges from about 3 μm to about 5 μm in thickness with a planar surface. The planarization layer PL can include an opening 190h that exposes a portion of the source electrode (not shown) or the drain electrode 150d. The source electrode (not shown) or the drain electrode 150d can be connected to the pixel electrode 190 through the opening 190h.

The pixel electrode 190 is formed on the planarization layer PL. The pixel electrode 190 can be electrically connected to the drain electrode 150d while filling in the opening 190h of the planarization layer PL. The pixel electrode 190 can be provided with a transparent electrode or a reflective electrode. When the pixel electrode 190 is provided with the transparent electrode, the pixel electrode 190 can be formed of ITO, IZO, ZnO, or $In_2O_3$. When the pixel electrode 190 is provided with the reflective electrode, the pixel electrode 190 can include a reflective layer formed of Ag, Mg, Al, Pt, Pd, Au, Ni, Nd, Ir, Cr, or a compound thereof, and a transparent layer formed of ITO, IZO, ZnO, or $In_2O_3$. In some embodiments, the pixel electrode 190 has a structure of ITO, Ag, and ITO.

The side gate electrode 190g can be formed on the planarization layer PL and can be formed on a side surface or side of the channel region 120c of the semiconductor pattern 120 through a via hole 62. That is, the side gate electrode 190g can be placed inside the via hole 62 to be formed on the side surface of the channel region 120c. The via hole 62 can penetrate through the planarization layer PL, the second interlayer dielectric ILD2, the first interlayer dielectric ILD1, and the gate insulating layer GI to expose an upper surface of the buffer layer 111 or the substrate 110. In some embodiments, the via hole 62 penetrates up to a portion of the buffer layer 111 or a portion of the substrate 110.

The via hole 62 can be formed at a predetermined distance apart from the semiconductor pattern 120. The separation distance between the via hole 62 and the semiconductor pattern 120 can be set to a distance at which the additional channel can be formed in the channel region 120c by an electric field by the side gate electrode 190g which is to be placed inside the via hole 62.

The via hole 62 can be extended in a length direction of one side surface of the channel region 120c to be substantially the same in length as the side surface of the channel region 120c.

The via hole 62 can meet a side surface of the top gate electrode 130g. Accordingly, the side gate electrode 190g which is to be placed inside the via hole 62 can be connected to the top gate electrode 130g.

The side gate electrode 190g can be formed of the same material and substantially simultaneously as the pixel electrode 190. The side gate electrode 190g can be formed of ITO, IZO, ZnO, $In_2O_3$, Ag, Mg, Al, Pt, Pd, Au, Ni, Nd, Ir, Cr or a compound thereof. In some embodiments, the side gate electrode 190g has the structure of ITO, Ag, and ITO.

As the thin film transistor array substrate 20 according to one or more embodiments includes the top gate electrode 130g and the side gate electrode 190g, additional channels can be formed in the channel region 120c of the semiconductor pattern 120. Accordingly, field mobility and switching performance of the TFT can be improved.

Figure 4:
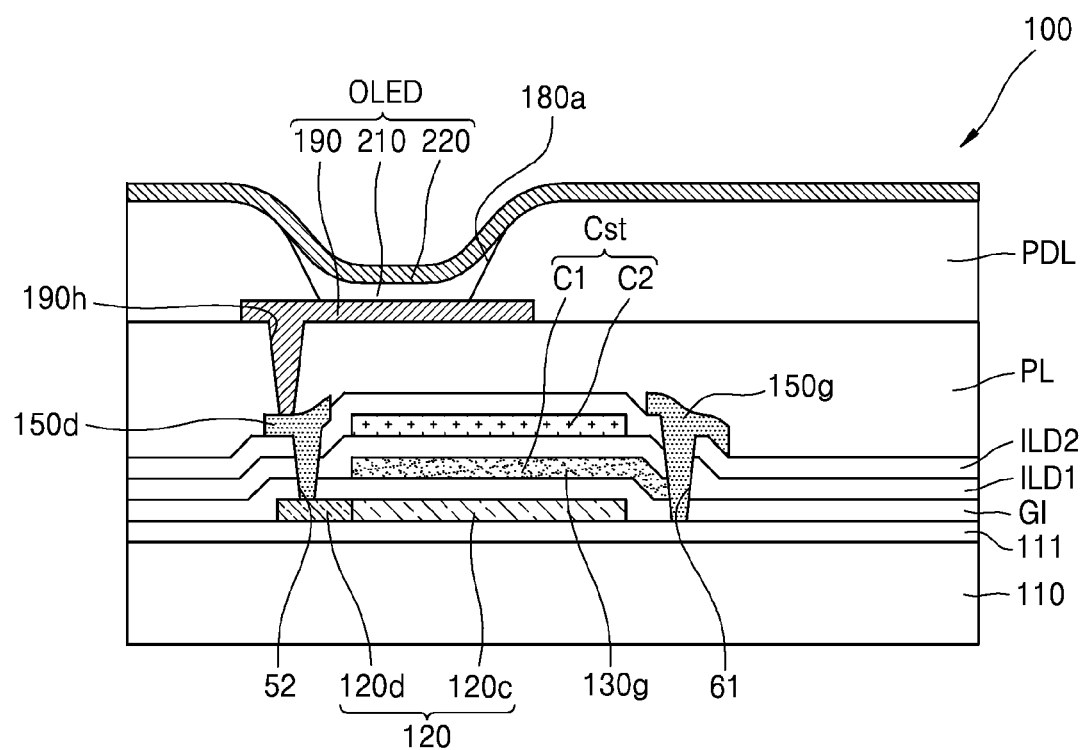
FIG. 4 is a cross-sectional view of an OLED display according to an embodiment.
Figure 5:
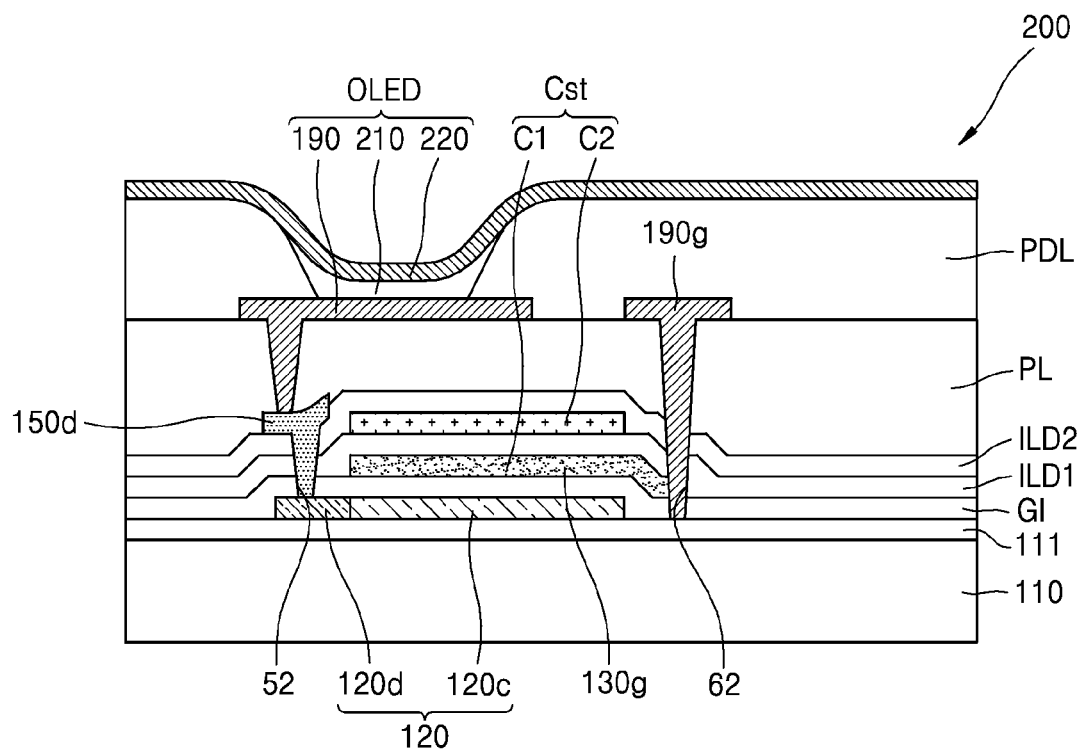
FIG. 5 is a cross-sectional view of an OLED display according to another embodiment.

FIGS. 4 and 5 are cross-sectional views of OLED displays 100 and 200 employing the thin film transistor array substrates 10 and 20 according to the above embodiments. In FIGS. 4 and 5, the same reference numerals as those in FIG. 2 denote the same elements. Here, repeated descriptions thereof will be omitted for simplification of explanation.

Referring to FIGS. 4 and 5, the OLED display 100 or 200 includes an OLED including a pixel electrode 190, an intermediate layer 210 which includes an organic emission layer, and an opposite electrode 220 on the thin film transistor array substrate 10 or 20. The OLED display 100 or 200 can further include a planarization layer PL and/or a pixel defining layer PDL on the thin film transistor array substrate 10 or 20.

In some embodiments, the OLED display 100 or 200 includes the substrate 110, the semiconductor pattern 120, the gate insulating layer GI, the side gate electrode 150g or 190g, the top gate electrode 130g, a source electrode (not shown), the drain electrode 150d and the OLED, and the side gate electrode 150g or 190g is placed inside the via hole 61 or 62 which penetrates through the gate insulating layer GI. Also, the OLED display 100 or 200 can further include the storage capacitor Cst that overlaps the top gate electrode 130g.

The planarization layer PL can be formed over the entire surface of the substrate 110 while at least partially covering the source electrode (not shown) and the drain electrode 150d. The planarization layer PL can be provided with an insulator and can be formed in a single layer or plural layers of an inorganic material, an organic material, or an organic/inorganic compound. In some embodiments, the planarization layer PL is formed of the organic material. As the planarization layer PL can be formed thicker when the planarization layer PL is formed of the organic material than when the planarization layer PL is formed of the inorganic material, parasitic capacitance can be reduced. In some embodiments, as the planarization layer PL is coated with a material such as polyacrylates, polyimides, or BCB, the planarization layer ranges from about 3 μm to about 5 μm in thickness with a planar surface. The planarization layer PL can include an opening 190h that exposes a portion of the source electrode (not shown) or the drain electrode 150d. The source electrode (not shown) or the drain electrode 150d can be connected to the pixel electrode 190 through the opening 190h.

The pixel electrode 190 is formed on the planarization layer PL. The pixel electrode 190 can be electrically connected to the drain electrode 150d while filling in the opening 190h of the planarization layer PL. The pixel electrode 190 can be provided with a transparent electrode or a reflective electrode. When the pixel electrode 190 is provided with the transparent electrode, the pixel electrode 190 can be formed of ITO, IZO, ZnO, or $In_2O_3$. When the pixel electrode 190 is provided with the reflective electrode, the pixel electrode 190 can include a reflective layer formed of Ag, Mg, Al, Pt, Pd, Au, Ni, Nd, Ir, Cr, or a compound thereof, and a transparent layer formed of ITO, IZO, ZnO, or $In_2O_3$. In some embodiments, the pixel electrode 190 has a structure of ITO, Ag, and ITO.

The pixel defining layer PDL can serve to define a pixel region and a non-pixel region. The pixel defining layer PDL includes an opening portion 180a in the pixel region and can be formed to at least partially cover the whole surface of substrate 110. As an intermediate layer 210 is formed in the opening portion 180a, the opening portion 180a can be the substantial pixel region.

The pixel electrode 190, the intermediate layer 210 and the opposite electrode 220 form the OLED. Light can be generated as holes and electrons injected from the pixel electrode 190 and the opposite electrode 220 of the OLED combine with each other in the organic emission layer of the intermediate layer 210.

The intermediate layer 210 can include the organic emission layer. In some embodiments, the intermediate layer 210 includes the organic emission layer and further includes at least one of a hole injection layer, a hole transport layer, an electron transport layer, and an electron injection layer. The described technology is not limited thereto, and the intermediate layer 210 can include the organic emission layer and can further include various functional layers.

The opposite electrode 220 is formed on the intermediate layer 210. The opposite electrode 220 forms an electric field with the pixel electrode 190 such that the light can be emitted from the intermediate layer 210. The pixel electrode 190 can have each of pixels patterned, and the opposite electrode 220 can be formed such that common voltage is applied to all pixels.

Each of the pixel electrode 190 and the opposite electrode 220 can be provided with the transparent electrode or the reflective electrode. While the pixel electrode 190 can function as an anode and the opposite electrode 220 can function as a cathode, the present embodiment is not limited thereto. For example, the pixel electrode 190 functions as the cathode and the opposite electrode 220 functions as the anode.

While only one OLED has been illustrated in the diagram, a display panel can include plural OLEDs. One pixel can be formed in each of the OLEDs, and each pixel can embody a red, green, blue, or white color.

However, the described technology is not limited thereto. The intermediate layer 210 can be formed commonly over the whole pixel electrode 190 regardless of the location of pixels. Here, the organic emission layer, for example, is formed in which layers including luminescent materials emitting lights of red, green, and blue are vertically stacked up or mixed up. It is possible to combine other colors if a white light can be emitted. Also, a color conversion layer converting the emitted white light into a predetermined color or a color filter can be further included.

A protection layer (not shown) can be formed on the opposite electrode 220 and can serve to at least partially cover and protect the OLED. For the protection layer (not shown), an inorganic insulating layer and/or an organic insulating layer can be used.

As described above, according to one or more embodiments, the thin film transistor array substrate 10, 11 or 20 is applied to the OLED display 100 or 200. However, the application of the thin film transistor array substrate 10, 11 or 20 is not limited thereto. The thin film transistor array substrate 10, 11 or 20 can be applied to various display apparatuses such as liquid crystal displays, plasma displays, and electrophoretic displays.

As described above, according to one or more embodiments, as a TFT includes a top gate electrode and a side gate electrode, additional channels is formed in a channel region of a semiconductor pattern. Accordingly, field mobility and switching performance of the TFT can be improved.

It should be understood that the exemplary embodiments described therein should be considered in a descriptive sense only and not for purposes of limitation. Descriptions of features or aspects within each embodiment should typically be considered as available for other similar features or aspects in other embodiments.

While the inventive technology has been described with reference to the figures, it will be understood by those of ordinary skill in the art that various changes in form and details can be made therein without departing from the spirit and scope of the present invention as defined by the following claims.

What is claimed is:

1. A thin film transistor (TFT) array substrate comprising at least one TFT, wherein the TFT comprises:
   a substrate;
   a semiconductor pattern comprising a source region, a channel region, and a drain region;
   a gate insulating layer covering the semiconductor pattern;
   a side gate electrode electrically insulated from the semiconductor pattern and formed over at least one side of the channel, region; and
   a top gate electrode formed over the gate insulating layer so as to partially overlap the semiconductor pattern, wherein the side gate electrode and the top gate electrode are electrically connected to each other, and
   wherein at least a portion of the side gate electrode is formed inside a via hole penetrating through the gate insulating layer.

2. The TFT array substrate of claim 1, further comprising a first interlayer dielectric layer covering the top gate electrode, wherein at least a portion of the side gate electrode is formed inside a via hole penetrating through, the gate insulating layer and the first interlayer dielectric layer, and wherein the side gate electrode is connected to the top gate electrode through the via hole.

3. The TFT array substrate of claim 1, further comprising a storage capacitor comprising:
a first electrode connected to the top gate electrode; and
a second electrode formed over an upper portion of the first electrode and electrically insulated from the first electrode.

4. The TFT array substrate of claim 3, wherein the top gate electrode is integrally formed on the same layer as the first electrode.

5. The TFT array substrate of claim 1, wherein the channel region is non-linear.

6. The TFT array substrate of claim 1, further comprising:
a source electrode connected to the source region; and
a drain electrode connected to the drain region,
wherein the side gate electrode is formed of the same material as the source and drain electrodes.

7. A thin film transistor (TFT) array substrate comprising:
a substrate;
a semiconductor pattern comprising a source region, a channel region, and a drain region;
a gate insulating layer covering the semiconductor pattern;
a side gate electrode electrically insulated from the semiconductor pattern and, formed over at least one side of the semiconductor pattern;
a top gate electrode formed over the gate insulating layer so as to partially overlap the semiconductor pattern;
a first interlayer dielectric layer covering the top gate electrode;
a storage capacitor configured to use the top gate electrode as a first electrode, wherein the storage capacitor comprises a second electrode formed over the first interlayer dielectric layer and overlapping the first electrode; and
a second interlayer dielectric layer formed over the second electrode,
wherein at least a portion of the side gate electrode is formed inside a via hole penetrating through the gate insulating layer, the first interlayer dielectric layer, and the second interlayer dielectric layer.

8. The TFT array substrate of claim 7, further comprising:
a source electrode formed over the second interlayer dielectric layer and connected to the source region through a first contact hole; and
a drain electrode formed over the second interlayer dielectric layer and connected to the drain region through a second contact hole,
wherein the first and second contact holes penetrate through the gate insulating layer and the first and second interlayer dielectric layers.

9. The TFT array substrate of claim 8, wherein the source and drain electrodes are formed of the same material as the side gate electrode.

10. The TFT array substrate of claim 8, further comprising:
a planarization layer at least partially covering the source and drain electrodes and comprising an opening which exposes a portion of the drain electrode; and
a pixel electrode formed over the planarization layer and connected to the drain electrode.

11. The TFT array substrate of claim 10, wherein at least a portion of the side gate electrode is formed, inside a via hole penetrating through the gate insulating layer, the first and second interlayer dielectric layers, and the planarization layer.

12. The TFT array substrate of claim 10, wherein the side gate electrode is formed of the same material as the pixel electrode.

13. An organic light-emitting diode (OLED) display, comprising:
the TFT array substrate of claim 1;
source and drain electrodes respectively connected to the source and drain regions; and
an OLED electrically connected to the source electrode or the drain electrode.

14. The display of claim 13, wherein the OLED comprises a pixel electrode, an intermediate layer comprising an organic light-emitting layer, and an opposite electrode.

15. The display of claim 14, wherein the side gate electrode is formed of the same material as the pixel electrode.

16. The display of claim 13, wherein, the side gate electrode is formed of the same material as the source electrode or the drain electrode.

17. The display of claim 13, further comprising a storage capacitor comprising a first electrode, a second electrode and an interlayer dielectric layer formed between the first electrode and the second electrode, wherein the top gate electrode is configured to be used as the first electrode, and wherein the second electrode overlaps the top gate electrode.

18. The display of claim 13, wherein the side gate electrode is higher than the top gate electrode.

19. The display of claim 13, wherein a bottom surface of the side gate electrode is closer to the surface than a bottom surface of the top gate electrode.

20. The TFT array substrate of claim 1, wherein the semiconductor pattern and the side gate electrode are formed on the same layer.

* * * * *